United States Patent [19]
Tozun et al.

[11] Patent Number: 5,651,035
[45] Date of Patent: Jul. 22, 1997

[54] APPARATUS FOR REDUCING JITTER OF A SPECTRUM SPREAD CLOCK SIGNAL AND METHOD THEREFOR

[75] Inventors: Orhan Tozun, Monte Sereno; Earl William McCune, Jr., Santa Clara, both of Calif.

[73] Assignee: International Microcircuits, Inc., Milpitas, Calif.

[21] Appl. No.: 430,575

[22] Filed: Apr. 28, 1995

[51] Int. Cl.⁶ .................. H04L 7/00; H04L 25/36; H04L 25/40
[52] U.S. Cl. .................. 375/373; 375/375; 327/156
[58] Field of Search .................. 375/354, 371, 375/373, 374, 375, 376; 327/141, 147, 148, 156, 157

[56] References Cited

U.S. PATENT DOCUMENTS

| | | | |
|---|---|---|---|
| 5,170,297 | 12/1992 | Wahler et al. | 375/374 X |
| 5,239,561 | 8/1993 | Wong et al. | 375/374 X |
| 5,285,483 | 2/1994 | Ogawa et al. | 375/374 X |
| 5,481,563 | 1/1996 | Hamre | 375/374 |

*Primary Examiner*—Tesfaldet Bocure
*Assistant Examiner*—Bryan Webster
*Attorney, Agent, or Firm*—Harry M. Weiss; Jeffrey D. Moy; Harry M. Weiss & Associates, P.C.

[57] ABSTRACT

An accumulator stores a signal representation of an accumulated angle that is incremented by an input angle in response to a reference clock pulse. The most significant bit (MSB) of the accumulated angle signals drives the input of a phase locked loop of the type that includes a loop filter, a frequency divider and a voltage controlled oscillator (VCO). A charge is injected into the loop filter during an overshoot interval during which the output of the frequency divider differs from the MSB. A compensating charge is injected into the loop filter to compensate for the charge injected during the overshoot interval. Jitter free spectrum spread clock pulses are provided by the VCO in response to the MSB.

5 Claims, 3 Drawing Sheets

APPARATUS FOR REDUCING JITTER OF A SPECTRUM SPREAD CLOCK SIGNAL AND METHOD THEREFOR

BACKGROUND OF THE INVENTION

1. Field of Invention

This invention is in the field of clock pulse generation for a digital machine and methods therefore and, more particularly, is an apparatus for generating a substantially jitter free spectrum spread clock signal and method therefor.

2. Description of the Prior Art

The average amplitude of the spectrum of undesired radiation caused by clock pulses in a digital computer is reduced when the frequency of the clock pulses continuously deviates from a center frequency. The clock pulses with the continuously deviating frequency are generated by a spectrum spread clock.

Spectrum spread clock pulses are generated by providing a digital signal representation of an input angle to a circuit arrangement that includes a type of digital storage device known as an accumulator. The accumulator is connected to a reference clock pulse generator. The accumulator has an output that provides a digital signal representation of an accumulated angle which is incremented by the input angle in response to a reference clock pulse.

The output of the accumulator is connected to a programmable read only memory (PROM) at its input. The PROM provides a digital signal representation of the sine of the accumulated angle.

The output of the PROM is connected to a digital to analog converter (D/A) that drives a squaring circuit which provides input pulses to a phase locked loop. The input pulses are at a frequency directly related to the input angle. The phase locked loop provides the spectrum spread clock pulses.

Although the circuit arrangement described hereinbefore is suitable for generating the spectrum spread clock pulses, it is costly because of the number of circuit components included therein. In an alternative circuit arrangement of reduced cost, the PROM, the D/A, the low pass filter and the squaring circuit are eliminated. The phase locked loop is driven by the most significant bit (MSB) of the output of the accumulator.

It should be appreciated that when the MSB undergoes a transition from a logic "1" signal to a logic "0" signal or vice versa, the accumulated angle typically changes by more than an angle represented by a least significant bit (LSB) of the accumulator. As a result, there is usually jitter of the MSB that results in a corresponding jitter of the spectrum spread clock pulses.

The jitter of the MSB is reduced by increasing the frequency of the reference clock and decreasing the input angle. Heretofore, there has not been an economical way of generating jitter free spectrum spread clock pulses when the MSB is not jitter free.

SUMMARY OF THE INVENTION

An object of the present invention is an apparatus and a method of reducing undesired coupling of a clock pulse via electromagnetic radiation and method therefor.

Another object of the present invention is an apparatus and a method for utilizing signal processing at a reduced frequency to generate spectrum spread clock pulses.

Another object of the present invention is an apparatus and a method for economically generating jitter free spectrum spread clock pulses.

BRIEF DESCRIPTION OF THE PREFERRED EMBODIMENT

According to the present invention, an accumulator stores a digital signal representation of an accumulated angle that is incremented by an input angle in response to a reference clock pulse. Spectrum spread clock pulses are provided by a phase locked loop in response to a signal representation of the most significant bit of the accumulated angle. A compensation network injects a current into a loop filter of the phase locked loop to compensate for current injected into the loop filter during an overshoot interval.

The present invention provides an apparatus and a method for economically generating jitter free spectrum spread clock pulses. Moreover, the spectrum spread clock pulses are generated in response to signals derived from a clock source that generates reference clock pulses at a frequency much lower than frequencies of a circuit arrangement in accordance with the prior art.

Other objects, features and advantages of the present invention will be apparent from the following description of the preferred embodiment as illustrated in the accompanying drawing.

DESCRIPTION OF THE PREFERRED EMBODIMENT

Figure 1:
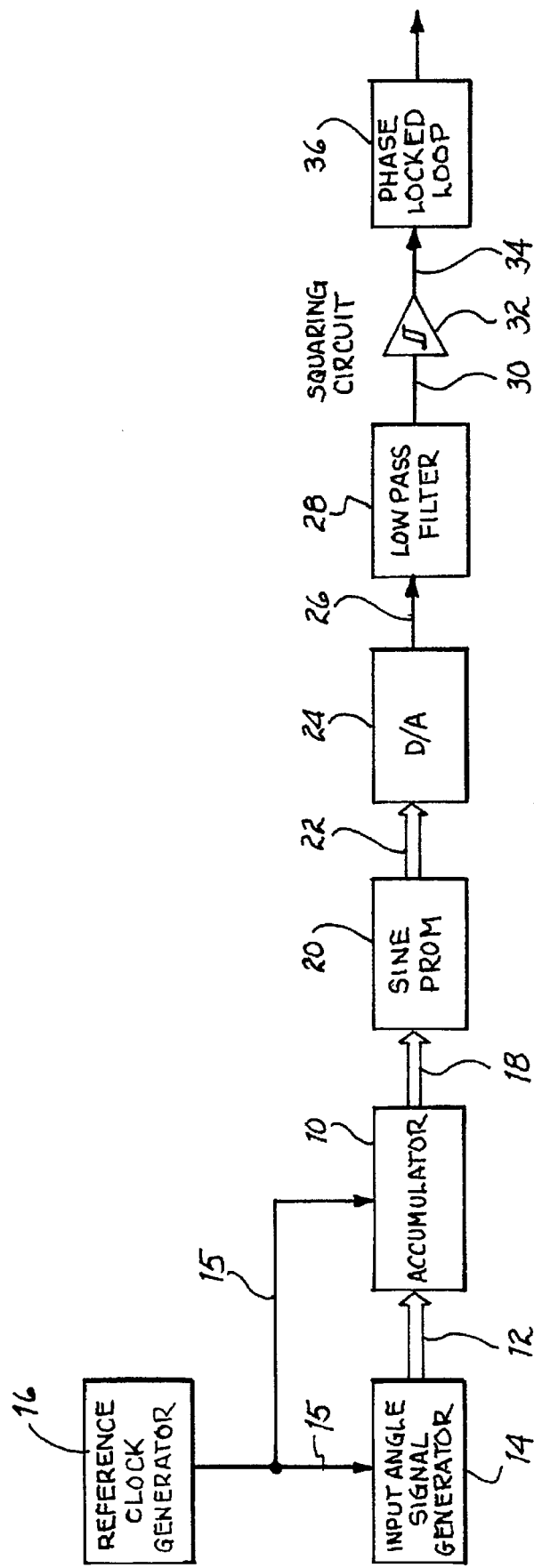
FIG. 1 is a block diagram of a circuit arrangement for generating spectrum spread clock pulses in accordance with the prior art.

As shown in FIG. 1, a well known circuit arrangement for generating spectrum spread clock pulses includes an accumulator 10 that has an input where a digital signal representation of an input angle is provided through a plurality of signal lines 12 by an input angle signal generator 14. Accumulator 10 is additionally connected through a signal line 15 to a reference clock pulse generator 16 whereby reference clock pulses are provided to accumulator 10.

Reference clock 16 is additionally connected to input angle generator 14 through line 15 whereby reference clock pulses are provided to input angle generator 14. The input angle signals are generated in response to the reference clock pulses.

Accumulator 10 stores a digital signal representation of an accumulated angle. The output of accumulator 10 is the signal representation of the accumulated angle. The accumulated angle is in accordance with a relationship which is given as:

$$P = \left( \sum_{i=1}^{\infty} M_i \right) \bmod K \tag{1}$$

where

P is the accumulated angle;

$M_i$ is the input angle;

$K = 2^n$;

K is the state size of accumulator 10; and n is the number of binary bits stored by accumulator 10.

When, for example, accumulator 10 stores a digital signal representation of zero, the accumulated angle is zero. In response to a first reference clock pulse, the accumulated angle is equal to the input angle. In response to a second reference clock pulse, the accumulated angle equals twice the input angle. Thus, the accumulated angle is incrementally increased in response to a reference clock pulse. Moreover, the increase equals the input angle.

Accumulator 10 is connected through a plurality of signal lines 18 to the input of a programmable read only memory 20 (referred to hereinafter as PROM 20). In response to the signal representation of the accumulated angle, PROM 20 provides at its output a digital signal representation of the sine of the accumulated angle.

It should be understood that when the input angle is small, successive reference clock pulses cause the output of PROM 20 to be representative of successive points on a waveform of a low frequency sinusoidal signal. Correspondingly, when the input angle is large, successive reference clock pulses cause the output of PROM 20 to be representative of successive points on a waveform of a high frequency sinusoidal signal. Therefore, the frequency of a sinusoid represented by the output of PROM 20 is determined by the input angle.

The output of PROM 20 is connected through a plurality of signal lines 22 to inputs of a digital to analog converter 24 (referred to hereinafter as D/A 24). In response to the digital signal representation of the sine of the accumulated angle, D/A 24 provides at its output a voltage that is an analog signal representation of the sine of the accumulated angle. Hence, when the input angle remains constant, the output of D/A 24 provides successive voltages that are respectively representative of successive points along a sinusoid.

The output of D/A 24 is connected through a signal line 26 to the input of a low pass filter 28. Filter 28 provides an output that is substantially an interpolation between the successive voltages that are provided by D/A 24. Accordingly, the output of filter 28 is a substantially sinusoidal voltage.

The output of filter 28 is connected through a signal line 30 to the input of a squaring circuit 32 of any suitable type. Circuit 32 provides at its output a voltage having a square waveform in response to a sinusoidal input voltage. Squaring circuits, such as a Schmitt trigger, are well known to those skilled in the art.

The output of squaring circuit 32 is connected through a signal line 34 to an input of a phase locked loop 36 that provides the spectrum spread clock pulses. Phase locked loops are well known to those skilled in the art.

Although the circuit arrangement described hereinbefore is suitable for providing the spectrum spread clock pulses, it is expensive and unreliable because it includes components such as PROM 20, D/A 24, filter 28 and squaring circuit 32; these are not included in the preferred embodiment.

Figure 2:
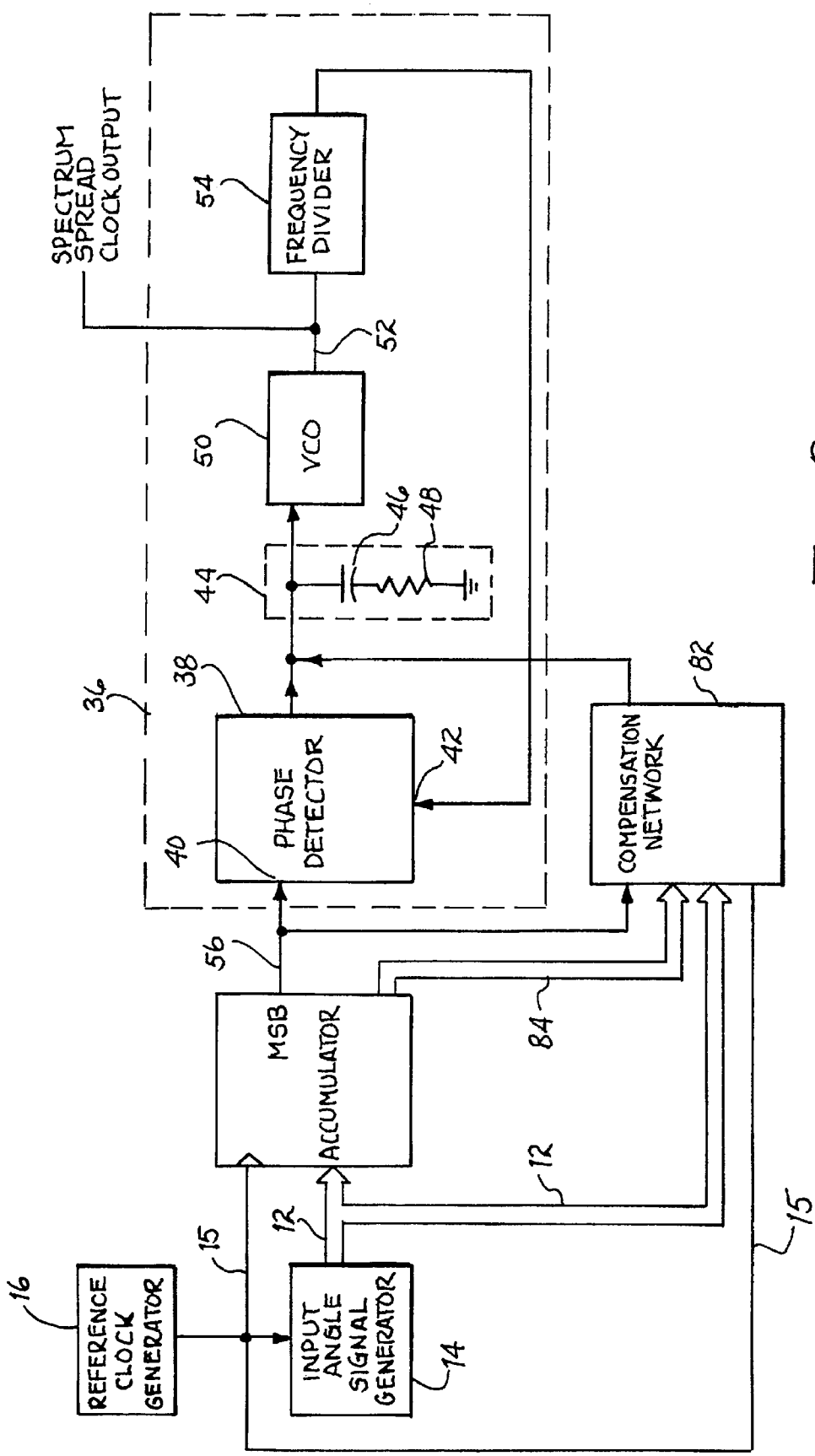
FIG. 2 is a schematic block diagram of the preferred embodiment of the present invention.

As shown in FIG. 2, phase locked loop 36 includes a phase detector 38 with inputs 40, 42 where pulses are compared. When, for example, logic "1" is provided at input 40 and logic "0" is provided at input 42, phase detector 38 provides an output current of a known polarity. Correspondingly, when logic "1" is provided at input 42 and logic "0" is provided at input 40, the output current is of a polarity opposite from the known polarity. When either logic "0" or logic "1" are simultaneously provided at inputs 40, 42, phase detector 38 does not provide current. Usually, when a phase locked loop is locked, either logic "0" or logic "1" are simultaneously provided at inputs to its phase detector.

The output of phase detector 38 is connected through a loop filter 44 to ground. Loop filter 44 is comprised of a capacitor 46 connected in series with a resistor 48. Because phase detector 38 provides current as described hereinbefore, phase detector 38 is operable to either charge or discharge capacitor 46 or maintain a charge thereon unchanged.

Loop filter 44 is connected to a voltage controlled oscillator 50 (referred to hereinafter as VCO 50) whereby loop filter 44 substantially provides a voltage stored on capacitor 46 to VCO 50. VCO 50 provides spectrum spread clock pulses at a spectrum spread clock frequency proportional to the voltage provided by loop filter 44.

The output of VCO 50 is connected through a signal line 52 to the input of a frequency divider 54. Divider 54 provides pulses at a frequency which is a submultiple of the spectrum spread clock frequency. The output of divider 54 is connected to input 42.

As explained hereinafter, there is a delay in providing logic "1" to input 40, thereby creating an overshoot interval during which logic "1" is provided at input 42 while logic "0" is provided at input 40. The overshoot interval is a manifestation of jitter in the spectrum spread clock signal. A salient feature of the present invention relates to compensating for logic "0" being provided at input 40 during the overshoot interval.

The most significant bit of the output of accumulator 10 is connected through a signal line 56 to input 40, whereby phase detector 38 is driven by a signal representation of the most significant bit (MSB) of the accumulated angle. From the input relationship given hereinbefore (equation 1), when the input angle is increased, the MSB provides pulses at an increased frequency because the state size, K, is finite.

Since phase locked loop 36 is locked, the frequency of the MSB pulses and the frequency of pulses provided by divider 54 are identical and the spectrum spread clock frequency is correspondingly increased. In a similar manner, when the input angle is decreased, the spectrum spread clock frequency is decreased.

Figure 3:
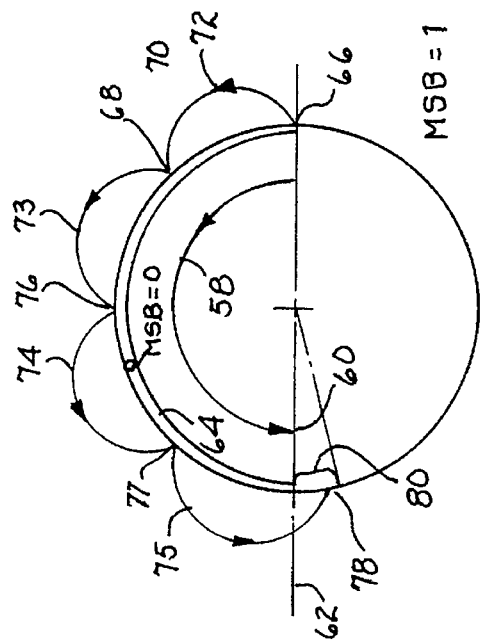
FIG. 3 is a graphic representation of the phases of signals in the embodiment of FIG. 1.

As shown in FIG. 3, a semicircular arc 58 is representative of when divider 54 provides logic "0". More particularly, time is measured by an angular displacement in a clockwise direction along arc 58. At a time represented by a location 60 on arc 58, there is an intersection between arc 58 and a datum line 62 when a pulse provided by VCO 50 causes the output of divider 54 to change from logic "0" to logic "1".

Similarly, an arc 64 is representative of when the MSB is logic "0". Arc 64 is concentric with arc 58.

At the time represented by a location 66 on arc 64, a reference clock pulse causes a jump change to a time represented by location 68 on arc 64. The angular displacement of location 66 from location 68 is a representation of the period of reference clock 16. The jump change from location 66 to location 68 is represented as taking place along an arc 70 in the direction of an arrow 72 for clarity.

In a similar manner, jump changes caused by reference clock pulses are represented as taking place along arcs 73, 74, 75 to locations 76, 77, 78 on arc 64, respectively. It should be understood that the number of jump changes is inversely related to the input angle.

At the time represented by location 78, a reference clock pulse causes the MSB to change from logic "0" to logic "1". An arc segment 80 extends from datum line 62 to location 78. Since the output of divider 54 changes from logic "0" to logic "1" at the time represented by location 60, arc segment 80 is representative of an overshoot interval during which divider 54 provides logic "1" and the MSB is logic "0".

Without compensation for the overshoot interval, there is jitter in the spectrum spread clock pulses.

It should be understood that when there is an increased reference clock frequency and an increased value of the state size, K, there is an increased number of jump changes of correspondingly reduced size. Accordingly, by increasing the reference clock frequency and increasing the state size, K, the overshoot interval is reduced. However, because of the present invention, a reference clock frequency as low as 14 megahertz is typically used to produce a spectrum spread clock frequency on the order of 140 megahertz.

The overshoot interval in accordance with a relationship which is given as:

$$\Delta T = [GT_c]/M \quad (2)$$

where

ΔT is the overshoot interval $T_c$ is the period of reference clock 26;

M is the input angle; and

G=P−K/2 immediately after the MSB changes from logic "0" to logic "1".

It should be understood that when the MSB changes from logic "0" to logic "1", the lower order bits stored in accumulator 10 are a binary signal representation of the quantity, G.

A charge is injected into loop filter 44 during the overshoot interval in accordance with a relationship which is given as:

$$Q_{os} = (i_{pd} G T_c)/M \quad (3)$$

where $Q_{os}$ is the injected charge;

M is the input angle; and $i_{pd}$ is current provided by phase detector 18 during the overshoot interval.

A compensating charge is removed from loop filter 44 during an interval equal to an integral number of periods of reference clock 16. The charge removal compensates for the charge injected into loop filter 44 during the overshoot interval. The compensating charge is removed when a current is provided to loop filter 44 in accordance with the following relationship:

$$Q_x = i_x(mT_c) = Q_{os} \quad (4)$$

where $Q_x$ is the compensating charge removed from loop filter 44;

$i_x$ is a current provided to loop filter 44 to cause the removal of the compensating charge, $Q_x$; and m is the number of periods of reference clock 16 during which the compensating charge is removed.

Combining relationships (3) and (4), $i_x = i_{pd} G/mM$ where M is the input angle. (5) In this embodiment, m=1.

To remove the charge, a compensation network 82 (FIG. 2) has inputs connected to accumulator 10 through line 56 and a plurality of signal lines 84, whereby the signal representation of the accumulated angle is provided to network 82. Additionally, network 82 is connected to reference clock 16 and input angle generator 14 through line 15 and lines 12, respectively. The output of network 82 is connected to loop filter 44.

Network 82 includes a storage register that stores the lower order bits stored in accumulator 10 and the input angle signals when the MSB changes from logic "0" to logic "1". Storage registers are well known to those skilled in the art.

Network 82 additionally includes a timing circuit that provides logic "1" in response to a first reference clock pulse after the MSB is logic "1" and provides logic "0" in response to a second reference clock pulse. Accordingly, the timing circuit provides logic "1" for a one period interval of reference clock 16.

The storage register and the output of the timing circuit are connected to inputs of a read only memory that is programmed to provide a digital signal representation of the current, $i_x$, during the one period interval and provide a signal representation of zero at all other times.

The output of the read only memory is connected to a digitally controlled current source that provides the current, $i_x$. Digitally controlled current sources are well known to those skilled in the art.

Figure 4:
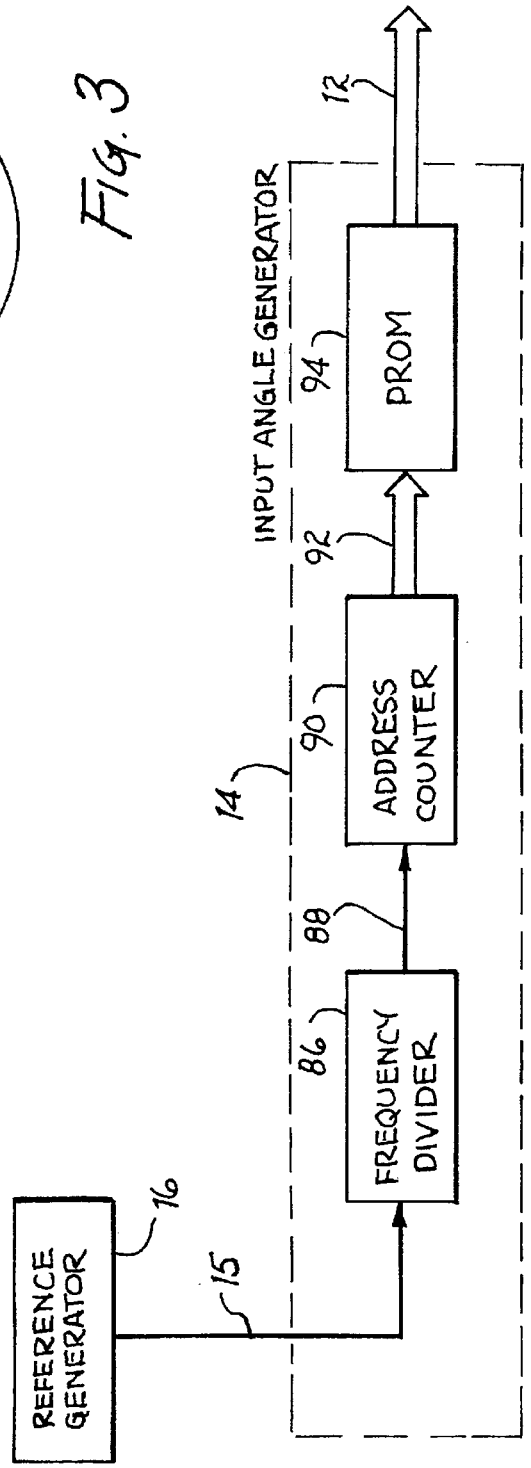
FIG. 4 is a block diagram of an input angle signal generator in the embodiment of FIG. 2.

As shown in FIG. 4, input angle generator 14 includes a frequency divider 86 that has its input connected through line 15 to reference clock 16. In response to the reference clock pulses, divider 86 provides reference divider pulses at a frequency that is a submultiple of the reference clock frequency.

The output of divider 86 is connected through a signal line 88 to the input of an address counter 90, whereby the reference divider pulses are provided to counter 90. Counter 90 is of a well known type that provides address signals that are a digital signal representation of a binary address number which is incremented in response to a reference divider pulse.

Therefore, the address signals are sequentially provided at a frequency which is a submultiple of the reference clock frequency. It should be understood that when the address number is a maximum, a reference divider pulse causes counter 90 to overflow and store a signal representation of zero.

The output of counter 90 is connected through a plurality of address lines 92 to the input of a programmable read only memory 94 (referred to as PROM 94 hereinafter). In response to the address signals, PROM 94 provides the input angle signals. Since PROM 94 is programmable, it is programmed to cause VCO 50 (FIG. 2) to provide the spectrum spread clock signals with a desired center frequency and a desired deviation therefrom.

While the invention has been particularly shown and described with reference to a preferred embodiment thereof, it should be understood by those skilled in the art that changes in form and detail may be made therein without departing from the spirit and scope of the invention.

We claim:

1. Apparatus for generating spectrum spread clock pulses, comprising:

a reference clock pulse generator that generates pulses at a reference clock frequency;

means for generating a digital signal representation of an input angle;

an accumulator connected to said reference clock and said generating means, said accumulator storing a digital signal representation of an accumulated angle in accordance with an input relationship which is given as:

$$P = \left( \sum_{i=1}^{\infty} M_i \right) \mod K$$

where
P is said accumulated angle;
M is said input angle;
$K=2^n$;
K is the state size of said accumulator; and
n is the number of binary bits stored by said accumulator;

a phase locked loop arranged to includes a loop filter and a frequency divider, said phase locked loop having an input that is driven by the most significant bit (MSB) of the output of said accumulator; and means for removing a compensating charge from said loop filter during an overshoot interval when the output of said frequency divider differs from said MSB, wherein said overshoot interval is in accordance with a relationship which is given as:

$$\Delta T = [GT_c]/M$$

where $\Delta T$ is the overshoot interval;
$G=P-K/2$ when the MSB changes from logic "0" to logic "1";
$T_c$ is the period of the pulses generated by said reference clock; and
M is said input angle.

2. The apparatus of claim 1, wherein a current provided by a phase detector of said phase locked loop causes a charge to be injected into said loop filter during said overshoot interval in accordance with a relationship which is given as:

$$Q_{os} = (i_{pd}GT_c)/M$$

where
$Q_{os}$ is said injected charge; and
$i_{pd}$ is said current provided by said phase detector.

3. The apparatus of claim 2 wherein said compensating charge is removed during an integral number of periods of said reference clock in accordance with a relationship which is given as:

$$Q_x = i_x(mT_c) = Q_{os}$$

where
$Q_x$ is the compensating charge;
m is the number of periods of the pulses of said reference clock during which said compensating charge is removed; and $$i_x = i_{pd}G/mM.$$

4. The apparatus of claim 1 wherein said generating means is connected to said reference clock and said input angle signals are provided in response to said reference clock pulses.

5. The apparatus of claim 4 wherein said generating means comprises:

a frequency divider that provides divider pulses at a frequency that is a submultiple of said reference clock frequency;

a counter that is incremented in response to a divider pulse to provide address signals; and a programmable read only memory that is connected to said counter, said programmable memory providing said input angle signals in response to said address signals.

* * * * *